United States Patent
Liberty et al.

(10) Patent No.: US 9,474,148 B2
(45) Date of Patent: Oct. 18, 2016

(54) STACKED CIRCUIT BOARD ASSEMBLY WITH COMPLIANT MIDDLE MEMBER

(71) Applicant: Trumpet Holdings, Inc., Milwaukee, WI (US)

(72) Inventors: James Liberty, Hollis, NH (US); John W. Ramonas, Saugus, MA (US); Dennis A. Maller, Racine, WI (US)

(73) Assignee: Trumpet Holdings, Inc., Milwaukee, WI (US)

( * ) Notice: Subject to any disclaimer, the term of this patent is extended or adjusted under 35 U.S.C. 154(b) by 289 days.

(21) Appl. No.: 14/038,352

(22) Filed: Sep. 26, 2013

(65) Prior Publication Data
US 2015/0085453 A1   Mar. 26, 2015

(51) Int. Cl.
*H05K 1/00* (2006.01)
*H05K 1/02* (2006.01)
*H05K 1/14* (2006.01)

(52) U.S. Cl.
CPC .......... *H05K 1/0271* (2013.01); *H05K 1/144* (2013.01); *H05K 2201/0133* (2013.01); *H05K 2201/2036* (2013.01); *H05K 2203/1322* (2013.01)

(58) Field of Classification Search
CPC ............ H05K 1/0271; H05K 2203/1322; H05K 2201/2036; H05K 1/144; H05K 2201/0133
USPC ........................................ 361/752
See application file for complete search history.

(56) References Cited

U.S. PATENT DOCUMENTS

| | | | |
|---|---|---|---|
| 4,768,286 A | 9/1988 | Ketchum | |
| 5,313,015 A * | 5/1994 | Hoge | H01R 23/6873 174/250 |
| 5,315,481 A * | 5/1994 | Smolley | 361/707 |
| 5,376,326 A | 12/1994 | Medney et al. | |
| 5,381,304 A | 1/1995 | Theroux et al. | |
| 6,311,621 B1 | 11/2001 | Marshall et al. | |
| 7,120,024 B2 * | 10/2006 | Watanabe et al. | 361/704 |
| 7,138,710 B2 | 11/2006 | Fukazawa | |
| 7,679,923 B2 | 3/2010 | Inagaki et al. | |
| 7,893,542 B2 | 2/2011 | Tachibana et al. | |
| 8,107,207 B2 | 1/2012 | Hotchkiss et al. | |
| 2005/0286198 A1 * | 12/2005 | Anthony et al. | 361/118 |
| 2006/0196702 A1 * | 9/2006 | Hansen | G01G 7/06 177/210 C |
| 2008/0194960 A1 * | 8/2008 | Randall | A61B 8/00 600/459 |
| 2010/0103634 A1 | 4/2010 | Funaya et al. | |
| 2010/0288551 A1 * | 11/2010 | Chen et al. | 174/350 |
| 2011/0128236 A1 * | 6/2011 | Faubert | 345/173 |
| 2011/0176284 A1 | 7/2011 | Ito et al. | |
| 2013/0307016 A1 * | 11/2013 | Lee | F21V 23/005 257/99 |

FOREIGN PATENT DOCUMENTS

| | | | | |
|---|---|---|---|---|
| JP | 02284506 A | 11/1990 | | |
| KR | WO 2012128458 A2 * | 9/2012 | | F21V 23/005 |

* cited by examiner

*Primary Examiner* — Adrian S Wilson
*Assistant Examiner* — Abhishek Rathod
(74) *Attorney, Agent, or Firm* — Ryan Kromholz & Manion, S.C.

(57) ABSTRACT

A compliant middle member to be used between encapsulated stacked circuit boards contained in an enclosure. The compliant middle member absorbing expansion forces from an encapsulant experiencing thermal expansion, thereby diverting and reducing the expansion forces exerted upon the electrical components.

8 Claims, 4 Drawing Sheets

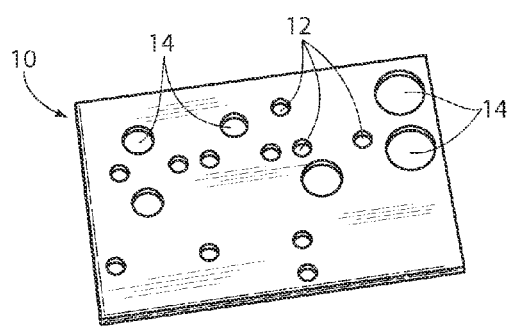
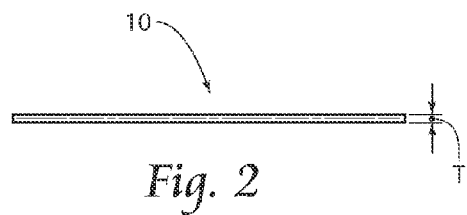
Fig. 1
Fig. 2
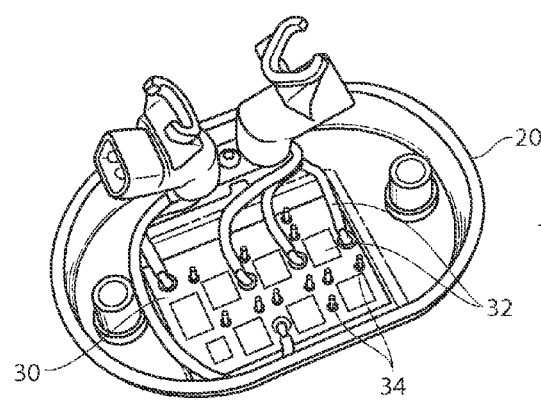
Fig. 3
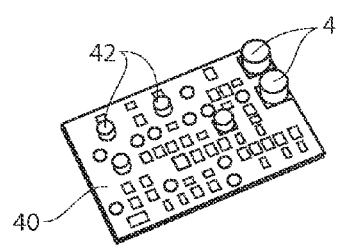
Fig. 4
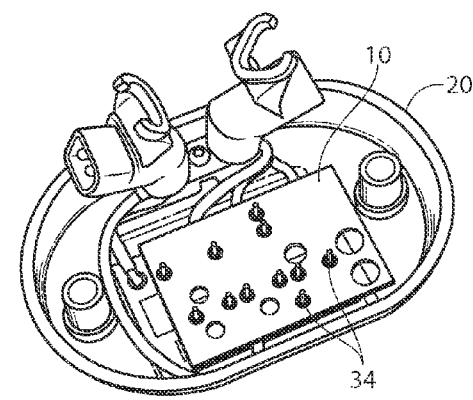
Fig. 5

STACKED CIRCUIT BOARD ASSEMBLY WITH COMPLIANT MIDDLE MEMBER

BACKGROUND OF THE INVENTION

Embodiments of the present invention relate generally to stacked electronic circuit boards and more specifically to improved encapsulated stacked electronic circuit boards.

It is known generally that heat is the enemy of electronic functionality, and that it is advantageous to conduct heat away from electronic components as effectively as possible. Heat may be induced by ambient conditions or from the electrical circuit boards themselves. One way to remove heat is to mount high heat producing components, like semiconductors, to metal clad (or metal backed) circuit boards and then mount the unpopulated surface of the metal clad circuit boards to a suitable heat sink or heat conduction medium such as a die cast or extruded aluminum housing. Any heat generated is transferred though the metal which provides a greater surface area to disperse the heat more rapidly in addition to reducing localized hot spots. However, metal clad circuit boards are limited in regards to design options, such as the fact that you can not put circuit vias through the metal layer as you can with a circuit board made of dielectric material. Because of the limitations it is typical that high power circuits built on metal clad circuit boards are built using single layer (or single sided) boards.

There are also situations wherein the physical constraints imposed on the packaging of an electronic assembly and the nature of the circuits encompassed make it desirable to construct the total circuit using stacked boards interconnected by pins even when the constraints associated with metal clad circuit boards are not a factor.

Commonly, All Terrain Vehicles (ATVs) employ electronic systems involving high power handling devices along with somewhat complex control circuits. One example would be electronic voltage regulators. The regulators are used to rectify and regulate alternating current (AC) generated by an AC Generator (ACG), typically driven from the engine crankshaft. Due to metal clad boards typically being confined to a single circuit board side it becomes difficult to make connections to all required points on a circuit, as such, the circuitry placed on the metal clad baord must be relatively simple. A preferred method to accommodate more complex circuitry, is to stack multiple boards.

Printed circuit boards constructed using insulating (or substitute "dielectric") materials as the base allow for the use of plated through holes and vias to pass signals between various layers on a multi-layer board and more simply from top to bottom on double sided boards. At the points where signal connections need to be made to the metal clad board, pins are soldered to the appropriate points, the pins being perpendicular to the plane of the metal clad board. Therefore, at least one circuit is laid out on a double-sided, or if necessary a multi-layer, control board with holes located appropriately to receive the pins from the metal clad board.

Furthermore, because voltage regulators are used on engine powered sports equipment, they are exposed to significant amounts of shock, vibration, moisture and other contamination. It is common practice to fully encapsulate the circuits. However, when the space between the two circuit boards is filled with the encapsulation compound and the assembly gets hot due to ambient or self generated heat, the expanding encapsulant can generate destructive forces attempting to push the circuit boards away from each other. These forces put tensile stress on the pins, and shear and tensile stress on the solder joints which can cause the pin solder joints to be broken.

Accordingly, the art of encapsulated circuit boards would benefit from an encapsulated circuit board which reduced the shearing of connecting pins due to expansion of the encapsulant.

SUMMARY OF THE INVENTION

The present invention relates to encapsulated stacked circuit boards, more particularly to reducing the shearing of connecting pins between the stacked circuit boards due to encapsulant expansion under heat by introducing a compliant middle member.

One aspect of the invention provides a stacked circuit board having at least a first and second circuit boards stacked one on top of the other in a housing having a compliant member positioned therebetween and encased by an encapsulant, whereby the compliant member compresses during thermal expansion of the encapsulant, thereby reducing expansion forces exerted on the first and second circuit boards.

The first and second circuit boards may also be joined in electrical communication by pins extending between the first and second circuit boards.

The compliant member may also have holes through which the pins may pass.

The compliant member may also be a closed-cell foam.

The compliant member may also be a closed-cell foam and a dielectric film.

The stacked circuit board may include a housing having at least three sides.

Another aspect of the invention provides a stacked circuit board including a housing, a first circuit board with pins, a second circuit board stacked on top of the first circuit board and in electronic communication with the first circuit board via connection with the pins, a compliant member between the first and second circuit boards, the compliant member having holes through which pass the pins, and an encapsulant, wherein the first and second circuit boards and compliant member are contained within the housing and surrounded by the encapsulant, and whereby the compliant member compresses during thermal expansion of the encapsulant, thereby reducing expansion forces exerted on the first and second circuit boards and the pins.

The compliant member may also be a closed-cell foam.

The compliant member may also be a closed-cell foam and a dielectric film.

The stacked circuit board may include a housing having at least three sides.

BRIEF DESCRIPTION OF THE DRAWINGS

FIG. 1 is a perspective view of an embodiment of the compliant member according to the present invention.

FIG. 2 is a side view of the compliant member of FIG. 1.

FIG. 3 is a perspective view of a first circuit board housed in a casting.

FIG. 4 is a perspective view of a second circuit board to be stacked on the first circuit board.

FIG. 5 is a perspective view of the compliant member placed on the first circuit board.

DESCRIPTION OF THE PREFERRED EMBODIMENT

Figure 6:
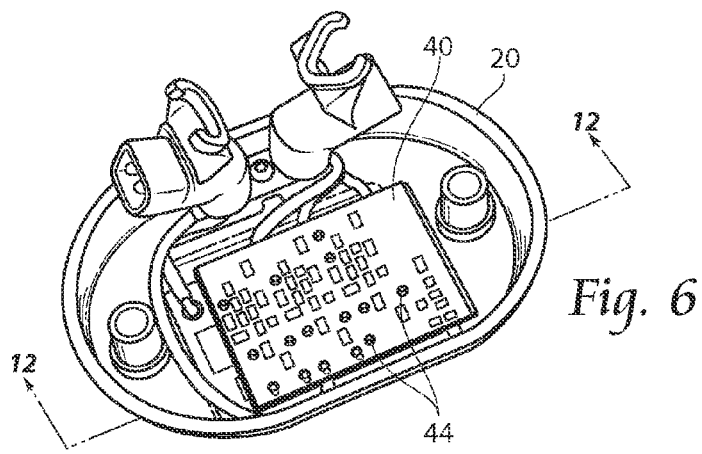
FIG. 6 is a perspective view of the second circuit board stacked on the first circuit board with the compliant member therebetween.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

FIGS. 1 and 2 illustrate a compliant member 10 according to the present invention. As shown here, the compliant member 10 is of a closed-cell foam design and comprises Urethane foam; however, it could also be made from other materials such as closed-cell silicone rubber or other foamed elastomers, as non-limiting examples. Alternatively, in addition to being a pure closed-cell foam sheet design, the compliant member 10 may also comprise a closed-cell foam applied to an insulation film such as MYLAR®, thereby providing both the compliance for expansion and also adding a dielectric film with good puncture resistance to assure that unintended conduction cannot occur between stacked boards 30 and 40 (described below) if the control board 40 is in close proximity of any conductive items 32 (components, lead wires, etc.) connected to the power board 30. It should be noted that the use of a control board 40 and a power board 30 as described herein is for illustrative purposes only and should not be viewed as limiting to only this particular layout. The present invention may be used with other types and combinations of stacked circuit boards.

In the embodiment shown, the compliant member 10 has a thickness T of approximately 0.060" when not employing a backer/liner, but may be as thin as 0.037" when incorporating a MYLAR® film backer. That being said, the compliant member may be of any thickness capable of providing the benefits as described herein and understood by those having skill in the art.

Additionally, the compliant member 10 is typically die cut to the same approximate outline as the control board 40 (FIG. 4) and has holes 12 for pins 34 (FIG. 5) to pass through. The holes 12 are close fit to the pins 34 but may have ample clearance to make it easier to drop the compliant member 10 over the pins 34. Additional holes 14 may be included to allow other components 42 to pass through so as not to interfere with the positioning of the compliant member 10.

Moving on to FIG. 3 in which one half of a housing, or casting, 20 is shown with a power circuit board 30 ("power board") affixed therein. The power board is a metal-clad circuit board as discussed previously. As shown here, the power board 30 is populated primarily with power components 32 which require high efficiency cooling, plus potentially a few other low power parts that need to be kept close to the power parts or for which the limitation of single sided board do not hinder placement. As the power board 30 is endowed with higher heat disbursement capabilities due to the attachment to metal, placing the higher power components 32 (i.e., the heat creating components) on the metal-clad circuit board helps to decrease the temperature of those higher power dissipating devices by moving heat through the metal clad board to the casting where it can be dissipated. The metal used in the present invention is an aluminum substrate; however, any metal capable of disbursing heat to the same or approximate degree, or better, would suffice.

FIG. 4 illustrates a control circuit board 40 ("control board") to be stacked with the power board 30. The control board 40 shown here is double-sided. Being double-sided allows for more complex circuits as circuit traces are permitted to cross on opposite sides of the board 40. The control board 40 could be a single layer board if it was sufficient to construct the control circuit, alternatively it could also be a multi-layer board having more than 2 layers.

The compliant member 10 is shown set atop the power board 30 in FIG. 5. As described earlier, the pins 34 extend through the holes 12. Furthermore, as shown in FIG. 6, the control board 40 is placed over the compliant member 10 with the pins 34 aligned with electrical junction points 44 on the control board 40. The pins 34 are then soldered to the electrical junction points 44 thereby providing electrical communication between the power board 30 and the control board 40.

Figure 7:
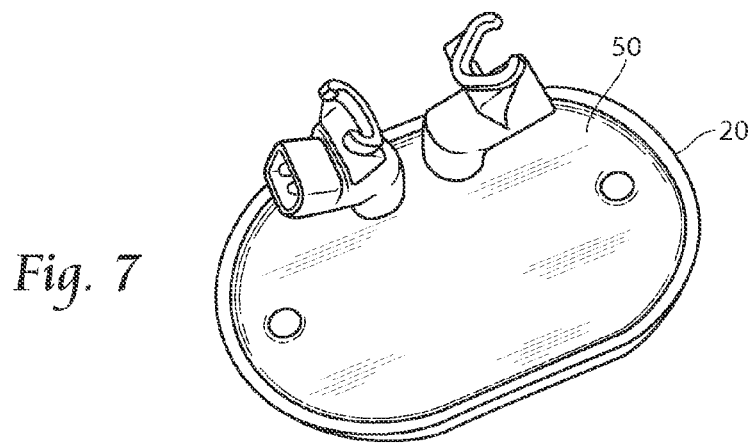
FIG. 7 is a perspective view of the stacked circuit board of FIG. 6 fully encased by an encapsulant.
Figure 8:
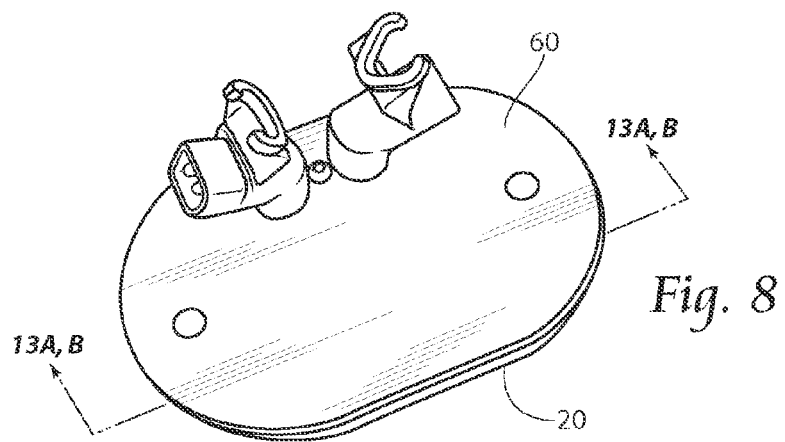
FIG. 8 is an exploded perspective view of the stacked circuit board of FIG. 7 with a cover.

Looking now to FIG. 7, the encapsulant 50 is shown enveloping the power board 30, the compliant member 10, and the control board 40. FIG. 8 illustrates a cover 60 which may be added for protection or improved aesthetics.

Figure 9:
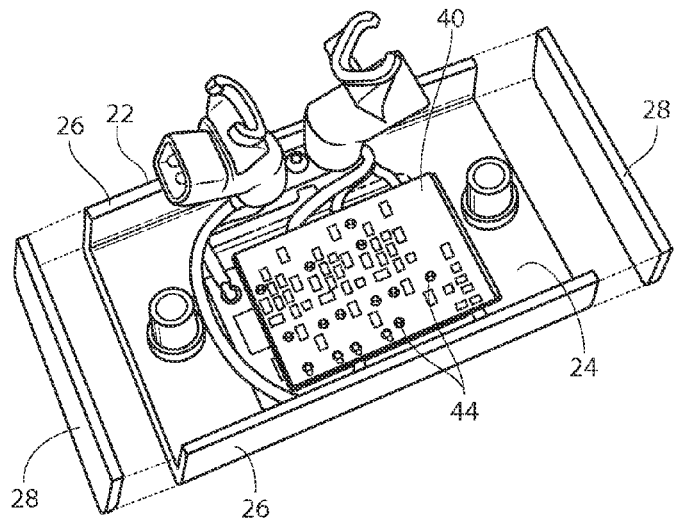
FIG. 9 is a perspective view of an alternative housing embodiment.
Figure 10:
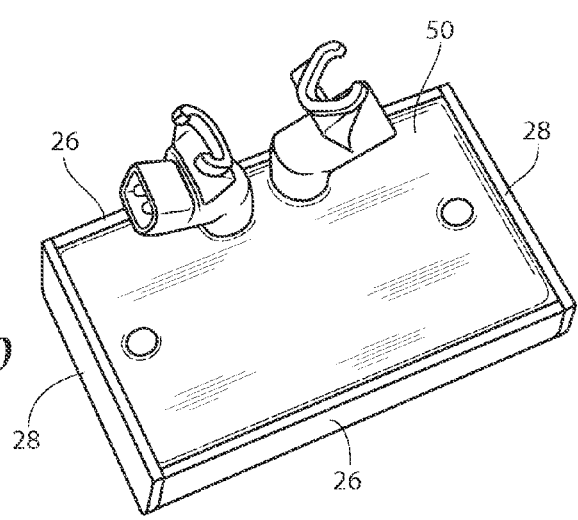
FIG. 10 is a perspective view of the housing of FIG. 9 with encapsulant.
Figure 11:
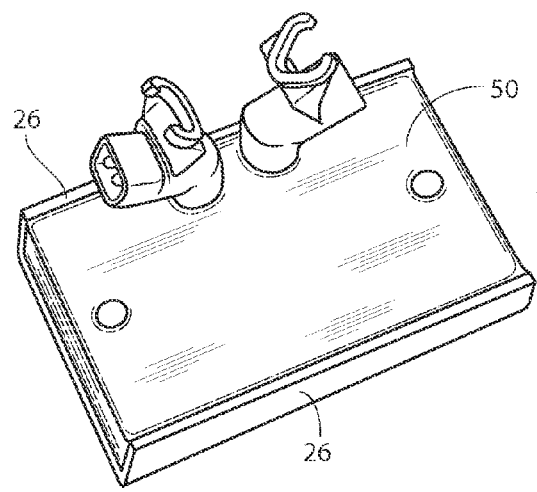
FIG. 11 is a perspective view of the housing shown in FIG. 10 but with the end barriers removed.

An alternative housing 22 is shown in FIGS. 9-11. The housing 22 comprises a bottom side 24 and two opposing sidewalls 26 contiguous with the bottom side 24. Two end barriers 28 may be temporarily secured to the housing 22 to contain the encapsulant 50 during installation and removed after the encapsulant 50 cures. In the alternative, the end barriers 28 may remain affixed to the housing 22. The end barriers 28 may be attached to the housing 22 by adhesive, screws, or other suitable means (not shown) known to those skilled in the art.

Figure 12:
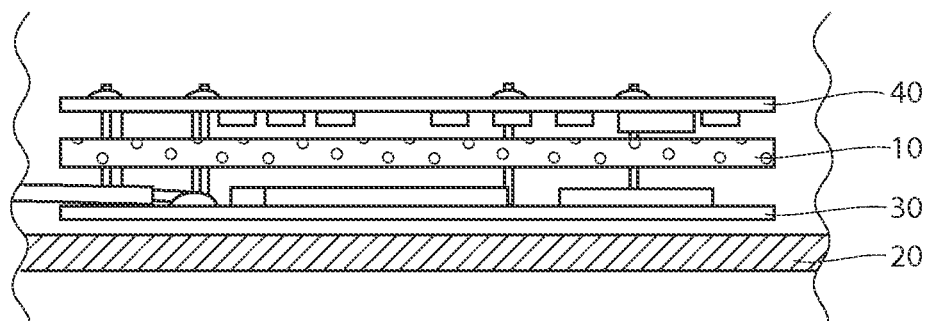
FIG. 12 is a cut-away view of the stacked circuit board along line 12-12 of FIG. 6.
Figure 13A:
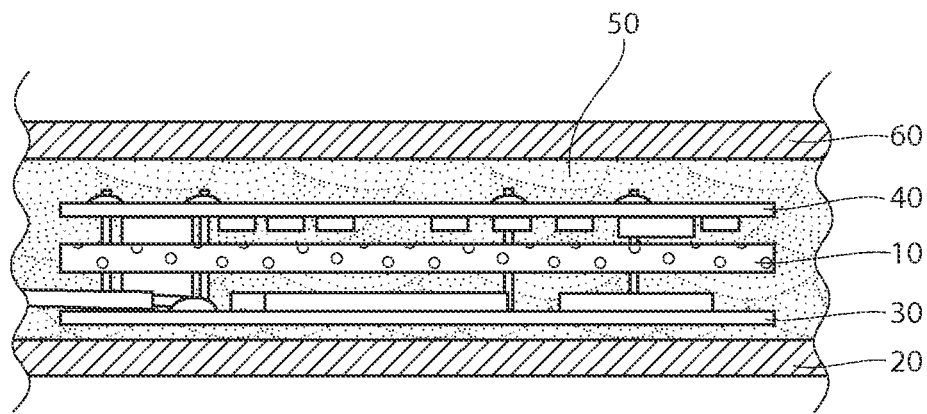
FIG. 13A is a cut-away view of the stacked circuit board along line 13A-13A of FIG. 8 before encapsulant expansion.
Figure 13B:
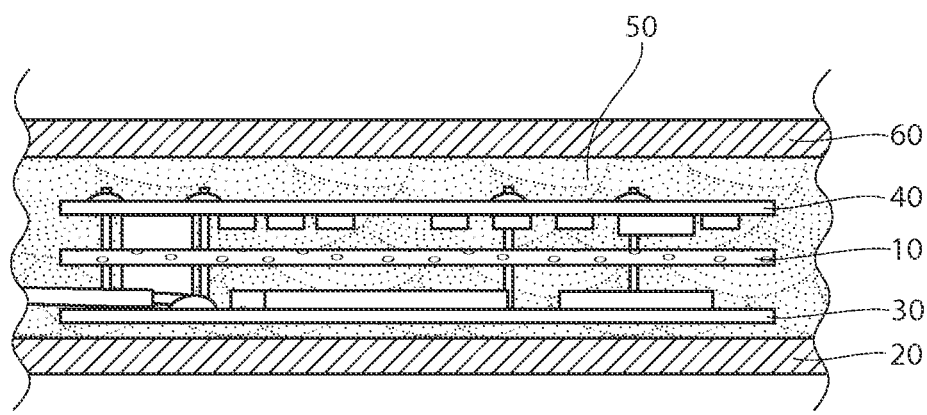
FIG. 13B is a cut-away view of the stacked circuit board along line 13B-13B of FIG. 8, encapsulant expanded.

Turning now to FIGS. 12-13B, wherein a cut away view of the stacked circuit boards 30 and 40 housed within the casting 20 is shown. FIG. 12 is a cut-away view along lines 12-12 of FIG. 6 and illustrates the stacked boards 30 and 40 before being surrounded by an encapsulant 50 (discussed below) with the power board 30 on the bottom, the control board 40 on the top, and the compliant member 10 placed in between.

FIG. 13A is a cut-away view of the stacked circuit board along line 13A-13A of FIG. 8. It illustrates a uniform disbursement of the encapsulant 50 throughout the casting 20. Common encapsulation materials, like those in the urethane family of compounds, tend to exhibit significant thermal expansion. Therefore, uniform disbursement of the encapsulant 50 is preferred because the thermal expansion and contraction will be more balanced on the electrical components.

The compliant member 10, being comprised of foam of substantially closed-cell design, will tend not to absorb any significant amount of the encapsulant 50 when encapsulant 50 is introduced into the casting 20. This permits the compliant member 10 to effectively compress during thermal expansion of the encapsulant 50 yet maintain a physical presence during encapsulant contraction to prevent damage to the electronics from shock or vibration at lower ambient and/or internal temperatures.

Compression of the compliant member 10 due to thermal expansion of the encapsulant 50 may be seen in FIG. 13B. The compliant member 10 absorbs the expansion of the encapsulant 50 and thereby reduces any stress imparted upon the boards 30 and 40, the pins 34, and the soldered electrical junction points 44 and minimizes the potential for breaking or shearing of these parts.

Performance of the compliant member's stated function has been confirmed with testing. Used here, a common hot/cold temperature cycling test placed the units in an environmental chamber where the ambient temperature was cycled between −40 degrees C. and +125 degrees C. with the device unpowered and with dwell time sufficient to allow the device to fully acquiesce within a few degrees of the temperature extremes. This took the units to extreme cold conditions that may likely be experienced in storage and transportation and also subjected the assembly to higher temperatures that could be experienced during operation in realistic elevated ambient temperatures with additional self induced heat. It was found that during testing of a unit like the one described herein, using HYSOL® USO152 as the encapsulant but not employing the compliant member 10, expansion forces typically broke the soldered electrical junction points 44. However, a device employing the compliant member 10, subjected to the same test conditions and using the same encapsulant, experienced significantly less internal expansion forces acting upon the internal electronics, thereby preventing damage to the stacked boards, pins, and junctions.

The foregoing is considered as illustrative only of the principles of the invention. Furthermore, since numerous modifications and changes will readily occur to those skilled in the art, it is not desired to limit the invention to the exact construction and operation shown and described. While the preferred embodiment has been described, the details may be changed without departing from the invention, which is defined by the claims.

We claim:

1. A stacked circuit board comprising:
   a housing;
   a compliant member comprising a closed-cell foam;
   a thermally expandable encapsulant; and
   at least a first and second circuit boards stacked one on top of the other in the housing having the compliant member positioned therebetween;
   the at least first and second circuit boards and compliant member located within the housing;
   the thermally expandable encapsulant located throughout the housing and encasing the at least first and second circuit boards and compliant member; and
   whereby the compliant member is configured to compress when the encapsulant experiences thermal expansion, thereby reducing expansion forces exerted on the first and second circuit boards.

2. The stacked circuit board of claim 1, wherein the first and second circuit boards are joined in electrical communication by pins extending between the first and second circuit boards.

3. The stacked circuit board of claim 2, wherein the compliant memeber has holes through which the pins may pass.

4. The stacked circuit board of claim 1, wherein the compliant member further comprises a dielectric film.

5. The stacked circuit board of claim 1, wherein the housing has at least three sides.

6. A stacked circuit board comprising:
   a housing;
   a first circuit board with pins;
   a second circuit board stacked on top of the first circuit board and in electronic communication with the first circuit board via connection with the pins;
   a compliant member, comprising a closed-cell foam, positioned between the first and second circuit boards;
   the compliant member having holes through pass the pins; and
   a thermally expandable encapsulant;
   the first and second circuit boards and compliant member contained within the housing;
   the thermally expandable encapsulant located throughout the housing and encasing the first circuit board, the second circuit board, and the compliant member; and
   whereby the compliant member is configured to compress when the encapsulant, experiences thermal expansion, thereby reducing expansion forces exerted on the first and second circuit boards and the pins.

7. The stacked circuit board of claim 6, wherein the compliant member further comprises a dielectric film.

8. The stacked circuit board of claim 6, herein the housing has at least three sides.

* * * * *